United States Patent [19]

Zibis et al.

[11] Patent Number: 4,703,290
[45] Date of Patent: Oct. 27, 1987

[54] ACOUSTIC WAVE FILTER

[75] Inventors: Peter Zibis, Munich; Richard Veith, Unterhaching, both of Fed. Rep. of Germany

[73] Assignee: Siemens Aktiengesellschaft, Berlin & Munich, Fed. Rep. of Germany

[21] Appl. No.: 787,111

[22] Filed: Oct. 15, 1985

[30] Foreign Application Priority Data

Oct. 18, 1984 [DE] Fed. Rep. of Germany ....... 3438246

[51] Int. Cl.$^4$ .............................................. H03H 9/64
[52] U.S. Cl. ................................ 333/195; 310/313 B; 310/313 D
[58] Field of Search ................................ 333/193–196, 333/150, 151, 153, 154; 310/313 R, 313 B, 313 C, 313 D

[56] References Cited

U.S. PATENT DOCUMENTS 3,882,433  5/1975  Subramanian ............... 310/313 B X
4,075,582  2/1978  Walker .................................. 333/196
4,325,037  4/1982  Bulst et al. .......................... 333/194

FOREIGN PATENT DOCUMENTS 0016979  3/1980  European Pat. Off. .

Primary Examiner—Eugene R. LaRoche
Assistant Examiner—Benny Lee
Attorney, Agent, or Firm—Hill, Van Santen, Steadman & Simpson

[57] ABSTRACT

An acoustic wave filter comprising a piezoelectric substrate body upon which at least two digital structures are formed and which comprise input and output transducers and at least one further digital structure and wherein the filter digital structure has a center frequency of $f_2$ and wherein the pass band of said two digital structures is at least twice as broad banded as said further digital structure and where the center frequencies $f_1$ and $f_2$ of the two digital structures are shifted relative to each other and relative to the center frequency $f_2$ of the further digital structure.

4 Claims, 3 Drawing Figures

ACOUSTIC WAVE FILTER

BACKGROUND OF THE INVENTION

1. Field of the Invention

This invention comprises an improvement on U.S. Pat. No. 4,325,037 which corresponds to European Patent No. 0 016 979 which disclose a filter having acoustic waves traveling in a substrate or close to the surface. So as to avoid triple transient signal in such a filter, the frequency of the more narrow-banded of two transducers in the filter is set to one of the other of two reflector frequencies $f_{R1}$ or $f_{R2}$. This technique is also used with a reflector arrangement which is composed of an input transducer and output transducer as well as reflector structures. Such devices are illustrated in FIG. 4 of U.S. Pat. No. 4,325,037 and the specification and description of U.S. Pat. No. 4,325,037 is hereby incorporated by reference into the present disclosure as background material.

SUMMARY OF THE INVENTION

Acoustic waves which are considered in the present invention are surface waves in the narrower sense (Raleigh waves; Bleustein waves), transversal and shear waves running close to the surface such as surface skimming bulk waves as well as components of longitudinally polarized volume waves which travel close to the surface. In this description, such wave types are referred to as surface waves in the broader sense. A particular type of wave which is generated on a case-by-case basis depends on measures familiar to persons skilled in the art in the dimensioning of transducers and under given conditions also on the anisortrophy properties of the substrate.

An improved acoustic wave filter comprising a piezoelectric substrate body comprising a wave filter 1 designated as resonator having two reflector structures 41 and 141 which can be viewed in the broader context as one reflector structure and which are respectively composed of corresponding reflector strips. The strips can be metallized strips or grooves. Input and output transducers 42 and 43 are also mounted on the substrate of the filter 1 and either one can be the input transducer or the output transducer. The main propagation direction of the waves occurring in the filter are indicated by the arrows 46 and the waves are indicated by 15. The filter 1 is formed on a substrate body and the elimination of interdigital reflection depends on the overall structure of the transducers 42 and 43 taken together. The length l of the interdigital structure from one end of the interdigital structure 42 to the opposite end of the interdigital structure 43 is $l=N\lambda$, where $\lambda$ is the average wavelength of the devices 42 and 43 and N is the number of wavelengths of the surface wavelengths 15 falling within the length l.

As is disclosed in U.S. Pat. No. 4,325,037, a noise signal $F_R$ generated by interdigital reflections which are undesirable per se is prevented in that the broader banded digital structures 42 and 43 have pass bands which are at least twice as wide as the narrow band digital reflector structures 41 and 141 and also in that one of the two frequencies $f_a$ and $f_b$ obtained from the formula and equivalent for the known filter is $$f_{a,b} = \frac{f_2}{1 \pm \frac{1}{2N-1}}$$

for the center frequency $f_1$ of the broader banded digital structure 42 and 43. The frequency $f_2$ is the center frequency of the narrower banded structures 41 and 141.

It is an object of the present invention to provide an additional improvement of a filter with reflector structures as described above wherein glitches and relative maximums are eliminated in the frequency curve of the new wave filter according to the invention. Glitches are perturbations of short duration and uncertain origin.

In the invention, the center frequencies of the transducers 42 and 43 are selected to be offset from the center frequency $f_2$, respectively, on opposite sides of the center frequency $f_2$.

Other objects, features and advantages of the invention will be readily apparent from the following description of certain preferred embodiments thereof, taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
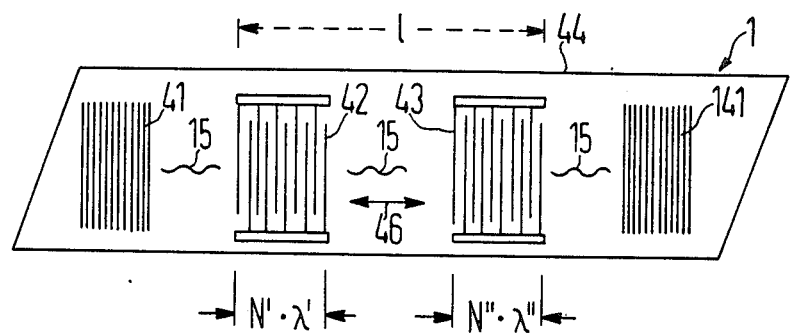
FIG. 1 is a plan view of the acoustic wave filter according to the invention.

FIG. 1 illustrates an acoustic wave filter 1 formed on a piezoelectric substrate. The filter can be used as a "front end" filter with corresponding optimally low loss or with low insertion attenuation. It is known that with prior art filters that a frequency glitch with additional relative maximum occurs in the filter curve in the proximity of the center frequency $f_2$ and the present invention eliminates such glitch. It has been discovered that with a corresponding filter of the invention comprising an input transducer 42 and an output transducer 43 that the glitch can be eliminated if the center frequency $f'_a$ is selected as the center frequency of one of the two transducers 42 or 43 as, for example, the transducer which is operated as the input transducer and the center frequency $f''_b$ of the other of these two transducers 42 or 43, for example, the output transducer lies at another of the two frequencies derived according to the principles of the invention but wherein the frequencies $f_1$ $f'_a$ and $f''_b$ are utilized and with the center frequencies of the two transducers 42 and 43 lying on opposite sides of the center frequency $f_2$ of the filter.

Transducers 42 and 43 having essentially the same identical wavelength number of the interdigital finger structures are preferably provided. In the invention, however, the frequency $f'_a$ and $f'_b$ or, respectively, $f''_a$ and $f''_b$ are based on values of N' and N".

The frequency $f'_a$ and $f'_b$ are the frequencies obtained for the transducer 42 using, respectively, the + and − signs in the following equation and $f''_a$ and $f''_b$ are the frequencies for transducer 43 using respectively the + and − signs. The value N' is the number of wavelengths in the transducer 42 and the value N″ is the number of wavelengths in the transducer 43.

$$f'_{a,b} = \frac{f_2}{1 \pm \frac{1}{N'-1}} \; ; f''_{1a,1b} = \frac{f_2}{1 \pm \frac{1}{N''-1}}$$

In the invention, as illustrated in FIG. 1, N′·λ′ is equal to the length of the transducer 42 and N″·λ″ is the length of the other transducer 43. One transducer is selected to have a frequency of f′$_a$ which is obtained from one of the operational signs plus or minus in the equation and the other transducer is selected to have a frequency of f″$_b$ using the other operational sign plus or minus.

In the invention the two transducers are mutually detuned by frequencies of $\Delta f' + \Delta f'' = |f'_a - f''_b|$, where the center frequency f$_2$ of the overall filter 1 is at least at approximately the same distance from the center frequencies f′$_a \ne$ f″$_b$ of the input transducer and of the output transducer which differ from each other. In the present invention, the reflector structures 41 and 141 have a pass band which is only one-half of the pass band of the input and output transducers 42 and 43 and the reflector structure 41, 141 has a resonant frequency of f$_2$ which is essentially identical to the selected center frequency of the overall wave filter illustrated in FIG. 1.

In the invention, the interdigital reflections in the relevant frequency range are rendered harmless both for the individual transducers 42 and 43 as between such transducers.

It is to be observed that the object of the invention can be technologically realized with a surprisingly simple means by in the manufacture of a filter according to the filter design providing either identical finger spacings or different finger spacings particularly using the manufacturing technique of the "step" PRO system (in this regard see German OS No. 33 14 602.0). In the present invention, different finger spacings are utilized for the input and the output transducers. The respective frequencies f′$_a$ and f″$_b$ for the input and output transducer 42 and 43 are based on the respective spacings of the fingers in the associated transducer 42 or 43.

Figure 2:
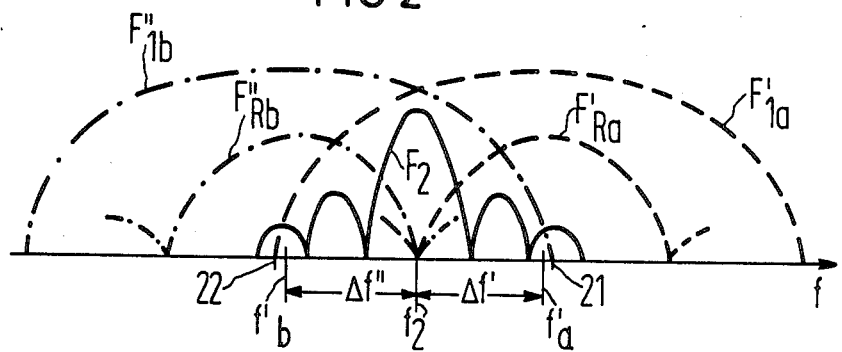
FIG. 2 is a plot of the frequency pattern of the filter of the invention.

FIG. 2 illustrates the frequency pattern of a filter of the invention according to FIG. 1. The frequency values are illustrated on the abscissa and the resonant curve of the narrow-banded reflector structure 41, 141 of the filter is referenced F$_2$. This resonant curve has the usual subsidiary maximums. The resonant frequencies of the two individual interdigital transducers 42 and 43 are shifted to opposite sides of the center frequency f$_2$ of the resonant curve F$_2$. The transducer 42, for example, has the resonant frequency f′$_a$ as shown in FIG. 2. The resonant curve associated with the transducer 42 is indicated F′$_{1a}$. In the invention, the interdigital transducer 43 has the center frequency of f″$_b$ and the resonant curve is illustrated as F$_{1b}$. The frequency curves F′$_{Ra}$ and F″$_{Rb}$ of the respective interdigital reflections are also indicated in FIG. 2. In the present invention, the respective one minimum of the curves F′$_{Ra'}$ and F″$_{Rb}$ coincides with the center frequency f$_2$ of the overall filter 1 so that the disturbances are minimized.

Figure 3:
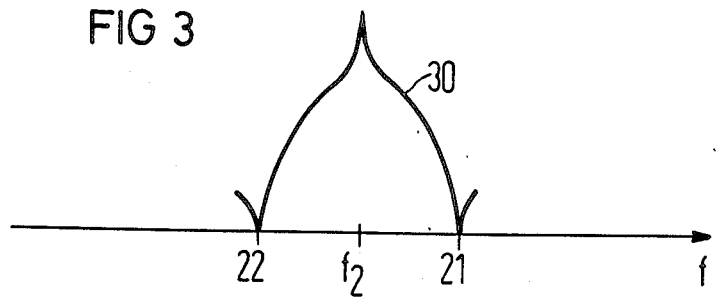
FIG. 3 is a plot of the filter curve of the overall filter of the invention.

FIG. 3 illustrates the filter curve 30 of the overall filter 1 of the invention. The first nulls to the right and left of the principle maximum coincide with the corresponding nulls 21 and 22 of the resonant curves F′$_{1a}$ and F″$_{1b}$ in FIG. 2. Using identical wavelengths numbers N′=N″ of both transducers, the nulls 21 or respectively 22 coincide with the frequencies f′$_a$ and F″$_b$.

It should be noted that the lengths of the transducers 42 and 43 are not exactly the same even if the same number of wavelengths for the original transducers are utilized. Since they derived from frequency value f′$_a$ which differs from f″$_b$ the finger spacings in one transducer will be made to be different from the finger spacings in the other transducer. The spacings of the fingers of a transducer produce the respective resonant frequency f′$_a$, f″$_b$ with wavelengths of λ′ and λ″.

Thus the wavelengths λ′ and λ″ will differ from each other. For values of the wavelength count N′ and N″ values between 10 and 300 should preferably be selected. The length of a respective digital transducer 42 and 43 determines the band width of the transducer.

Thus, in the present invention, the transducers 42 and 43 are selected to have different center frequencies which differ from the center frequency of the overall filter and lie on opposite sides thereof so as to eliminate glitches and other undesired responses.

Although the invention has been described with respect to preferred embodiments, it is not to be so limited as changes and modifications can be made which are within the full intended scope of the invention as defined by the appended claims.

We claim as our invention:

1. An acoustic wave filter having a bandwidth and a center frequency f$_2$ comprising a piezoelectric substrate with a planar surface, first and second digital structures (42, 43) which are finger structures with broad bandwidths, both digital structures are mounted on said planar surface of said substrate, a further digital structure, (41, 141) mounted on said planar surface of said substrate, said further digital structure has a center frequency f$_2$ and a bandwidth F$_2$ which is at least one half as broad band as said first and second digital structures, and whereby the center frequency f$_1$ of said first and second digital structures is shifted relative to the center frequency f$_2$ according to the equation $$f_1 = \frac{f_2}{1 \pm \frac{1}{N-1}}$$

wherein N is a wavelength number, characterized in that the resonant frequency f′$_1$ of said first digital structure (42) is determined using the negative sign and the resonant frequency f″$_1$ of said second digital structure is obtained using the plus sign and:

$$f'_1 = \frac{f_2}{1 - \frac{1}{N'-1}}, \text{ and } f''_1 = \frac{f_2}{1 + \frac{1}{N''-1}},$$

wherein N′ is the number of wavelengths λ′ in the bandwidth of said first digital structure (42), and N″ is the number of wavelengths λ″ in the bandwidth of said second digital structure (43) and whereby N′ and N″ are numerical values selected to be about the same and wherein said first and second digital structure have different physical dimensions which causes them to have different electrical characteristics.

2. An acoustic wave filter according to claim 1, characterized in that the band width F$_2$ of said further digital structure (41, 141) is narrower in band width by at least a factor of 5 than the band width of the digital structures of said first and second digital structures (42, 43).

3. An acoustic wave filter according to claim 1 or 2, characterized in that the narrower band further digital structure (41, 141) is a signal reflector.

4. An acoustic wave filter according to claim 1 or 2 characterized in that said first digital structure is an input transducer and said second digital structure (43) is an output transducer.

* * * * *